United States Patent
Rickerby

(10) Patent No.: US 6,221,512 B1
(45) Date of Patent: Apr. 24, 2001

(54) METALLIC ARTICLE HAVING A THERMAL BARRIER COATING AND A METHOD OF APPLICATION THEREOF

(75) Inventor: David S Rickerby, Derby (GB)

(73) Assignees: Rolls-Royce PLC, London; Chromalloy United Kingdom Limited, Nottingham, both of (GB)

( * ) Notice: Subject to any disclaimer, the term of this patent is extended or adjusted under 35 U.S.C. 154(b) by 0 days.

(21) Appl. No.: 09/314,029

(22) Filed: May 19, 1999

(30) Foreign Application Priority Data

May 29, 1998 (GB) .................................................. 9811456

(51) Int. Cl.$^7$ .............................. B32B 9/00; B32B 15/00; C23C 16/00
(52) U.S. Cl. .......................... 428/623; 428/629; 428/633; 428/670; 428/678; 428/680; 428/472; 427/250; 427/251; 427/419.1; 427/419.2; 416/241 R; 416/241 B
(58) Field of Search ..................................... 428/141, 472, 428/629, 632, 633, 623, 678, 670, 680; 416/241 R, 241 B; 427/250, 251, 419.1, 419.2

(56) References Cited

U.S. PATENT DOCUMENTS

| 4,321,310 | 3/1982 | Ulion et al. . |
| 4,321,311 | 3/1982 | Strangman . |
| 4,676,994 | 6/1987 | Demaray . |
| 5,350,599 | 9/1994 | Rigney et al. . |
| 5,624,721 | 4/1997 | Strangman . |
| 5,716,720 | * | 2/1998 | Murphy ................................ 428/623 |

FOREIGN PATENT DOCUMENTS

| 0718419 | 6/1996 | (EP) . |
| 0718420 | 6/1996 | (EP) . |
| 0 733 723 A1 | 9/1996 | (EP) . |
| WO 93/18199 | 9/1993 | (WO) . |

* cited by examiner

Primary Examiner—Deborah Jones
Assistant Examiner—Bryant Young
(74) Attorney, Agent, or Firm—Oliff & Berridge, PLC

(57) ABSTRACT

A metallic article (30) comprises a bond coating (34) on the metallic article (30) and a ceramic thermal barrier coating (38) on the bond coating (34). The ceramic thermal barrier coating (38) comprises a plurality of columnar grains (40) extending substantially perpendicular to the surface of the metallic article (30). The ceramic thermal barrier coating (38) has an inner portion (44), a transition portion (46) and an outer portion (48). Each columnar grain (40) has a substantially constant cross-sectional area throughout its length in the outer portion (48), has smooth surfaces and there are distinct uniform gaps (42) between columnar grains to minimize the stress/strain in the columnar grains (40) and/or to minimize the stress/strain between adjacent columnar grains (40) and thereby increases the resistance to spallation of the ceramic thermal barrier coating. The columnar grains (40) are produced by controlling the evaporation rate of the ceramic, the temperature and speed of rotation of the article (30).

27 Claims, 6 Drawing Sheets

METALLIC ARTICLE HAVING A THERMAL BARRIER COATING AND A METHOD OF APPLICATION THEREOF

BACKGROUND OF THE INVENTION

The present invention relates to a thermal barrier coating applied to the surface of a superalloy article e.g. a gas turbine engine turbine blade, and to a method of applying the thermal barrier coating. The invention particularly relates to ceramic thermal barrier coatings.

The constant demand for increased operating temperature in gas turbine engines was initially met by air cooling of the turbine blades and turbine vanes and the development of superalloys from which to manufacture the turbine blades and turbine vanes, both of which extended their service lives. Further temperature increases necessitated the development of ceramic coating materials with which to insulate the turbine blades and turbine vanes from the heat contained in the gases discharged from the combustion chambers, again the operating lives of the turbine blades and turbine vanes was extended.

It is known in the prior art to apply these ceramic coating materials by the thermal or plasma spray process onto a suitable bond coating, for example a MCrAlY alloy bond coating, which has been applied to the metallic substrate.

It is also known in the prior art to apply these ceramic coating materials by the physical vapor deposition process onto a suitable bond coating which has an alumina interface layer, for example a MCrAlY alloy bond coating or a diffusion aluminide bond coating, which has been applied to the metallic substrate.

It is also known in the prior art to apply these ceramic coating materials by plasma spraying or physical vapor deposition processes onto an oxide layer on the metallic substrate.

The ceramic thermal barrier coatings deposited by the physical vapor deposition process has benefits over the ceramic thermal barrier coating deposited by plasma spraying. The main benefit is improved thermal shock resistance due to the columnar structure of the ceramic thermal barrier coating produced by the physical vapor deposition process.

One problem associated with thermal barrier coatings produced by physical vapor deposition is that they suffer from spallation of the ceramic thermal barrier coating. Spallation of the ceramic thermal barrier coating is the loss of the ceramic thermal barrier coating by flaking from the bond coating due to the thermal cycling conditions. Currently it has been found that the ceramic thermal barrier coatings produced by Chromalloy United Kingdom Limited have spalled at the leading edge and trailing edge regions of the turbine blades and turbine vanes or other regions where there is a rapid change in the shape of the component.

SUMMARY OF THE INVENTION

The present invention seeks to provide a metallic article with a thermal barrier coating deposited by physical vapor deposition which is more resistant to spallation of the ceramic thermal barrier coating. The present invention also seeks to provide a method of applying a thermal barrier coating by physical vapor deposition which is more resistant to spallation of the ceramic thermal barrier coating.

Accordingly the present invention provides a metallic article comprising a bond coating on the metallic article and a ceramic thermal barrier coating on the bond coating, the ceramic thermal barrier coating comprising a plurality of columnar grains extending substantially perpendicular to the surface of the metallic article, the ceramic thermal barrier coating comprising an inner portion adjacent the bond coating, a transition portion on the inner portion and an outer portion on the transition portion, the inner portion having columnar grains grown in a competitive manner, the outer portion having columnar grains grown in a steady state manner, the transition portion having columnar grains grown in transition from competitive manner to steady state manner, in the outer portion each columnar grain having substantially constant cross-sectional area throughout its length, each columnar grain having smooth sides without the presence of sub-grains projecting therefrom and each columnar grain being separated from adjacent columnar grains by uniform clearances to minimize the stress/strain in the columnar grains and/or to minimize the stress/strain between adjacent columnar grains and thereby increase the resistance to spallation of the ceramic thermal barrier coating.

Preferably the bond coating comprises an aluminum containing bond coating on the metallic article, the aluminum containing bond coating has an alumina surface layer, the ceramic thermal barrier coating is arranged on the alumina layer.

The aluminum containing bond coating may comprise a MCrAlY bond coating, where M is at least one of cobalt, iron and nickel, or a diffusion aluminide coating.

Preferably bond coating comprises a MCrAlY bond coating on the metallic article, where M is at least one of cobalt, iron and nickel, a platinum enriched MCrAlY layer on the MCrAlY bond coating, a platinum aluminide layer on the platinum enriched MCrAlY layer, the platinum aluminide layer has an alumina surface layer, the ceramic thermal barrier coating is arranged on the alumina layer.

Alternatively the metallic article has an alumina surface layer, the ceramic thermal barrier coating is arranged on the alumina layer.

The metallic article may comprise a nickel superalloy article or a cobalt superalloy article.

The metallic article may comprise a turbine blade or a turbine vane.

The ceramic thermal barrier coating may comprise zirconia. The zirconia may be stabilized with yttria.

Preferably the outer portion is between 38% and 67% of the thickness of the ceramic thermal barrier coating. More preferably the outer portion is between 40% and 60% of the thickness of the ceramic thermal barrier coating.

Preferably the width of the columnar ceramic grains in the outer portion increases at a rate equal to or less than 2.0 micrometers per 100 micrometer length of the columnar ceramic grain. More preferably the width of the columnar ceramic grains in the outer portion increases at a rate equal to or less than 1.7 micrometers per 100 micrometer length of the columnar ceramic grain. More preferably the width of the columnar ceramic grains in the outer portion increases at a rate equal to or less than 0.24 micrometers per 100 micrometer length of the columnar ceramic grain.

The present invention also provides a method of applying a ceramic thermal barrier coating to a metallic article, comprising the steps of:—forming a bond coating on the metallic article, applying a ceramic thermal barrier coating to the bond coating by vapor deposition to form a plurality of columnar grains extend substantially perpendicular to the surface of the metallic article, the vapor deposition of the ceramic thermal barrier coating comprising depositing an inner portion adjacent the bond coating, depositing a transition portion on the inner portion and depositing an outer portion on the transition portion, the inner portion having columnar grains grown in a competitive manner, the outer portion having columnar grains grown in a steady state manner, the transition portion having columnar grains grown in transition from competitive manner to steady state manner, and in the outer portion each columnar grain having a substantially constant cross-sectional area throughout its length, each columnar grain having smooth sides without the presence of sub-grains projecting therefrom and each columnar grain being separated from adjacent columnar grains by uniform clearances to minimize the stress/strain in the columnar grain and/or to minimize the stress/strain between adjacent columnar grains and thereby increase the resistance to spallation of the ceramic thermal barrier coating.

Preferably the method comprises controlling the rate of evaporation of the ceramic, the temperature of the metallic article and the rate of rotation of the metallic article during the vapor deposition of the ceramic thermal barrier coating.

Preferably the evaporation rate of ceramic is 3 to 5 micrometers per minute, the temperature of the metallic article is 1000° C. to 1100° C. and the rate of rotation of the metallic article is 15 revolutions per minute.

The method may comprise applying an aluminum containing bond coating on the metallic article and forming an alumina layer on the aluminum containing bond coating.

The aluminum containing bond coating may comprise a MCrAlY alloy, where M is at least one of cobalt, iron and nickel, an aluminide or a platinum aluminide.

The method may comprise applying a MCrAlY bond coating on the metallic article, where M is at least one of cobalt, iron and nickel, forming a platinum enriched MCrAlY layer on the MCrAlY bond coating, forming a platinum aluminide layer on the platinum enriched MCrAlY layer, forming an alumina surface layer on the platinum aluminide layer.

The method may comprise forming an alumina surface layer on the metallic article.

The metallic article may be formed from a nickel superalloy article or a cobalt superalloy article.

The metallic article may comprise a turbine blade or a turbine vane.

The ceramic thermal barrier coating may comprise zirconia, preferably zirconia stabilized with yttria.

The ceramic thermal barrier coating may be applied by physical vapor deposition, preferably electron beam physical vapor deposition.

BRIEF DESCRIPTION OF THE DRAWINGS

The present invention will be more fully described by way of example with reference to the accompanying drawings, in which:—

DETAILED DESCRIPTION OF THE EXEMPLARY EMBODIMENTS

Figure 1:
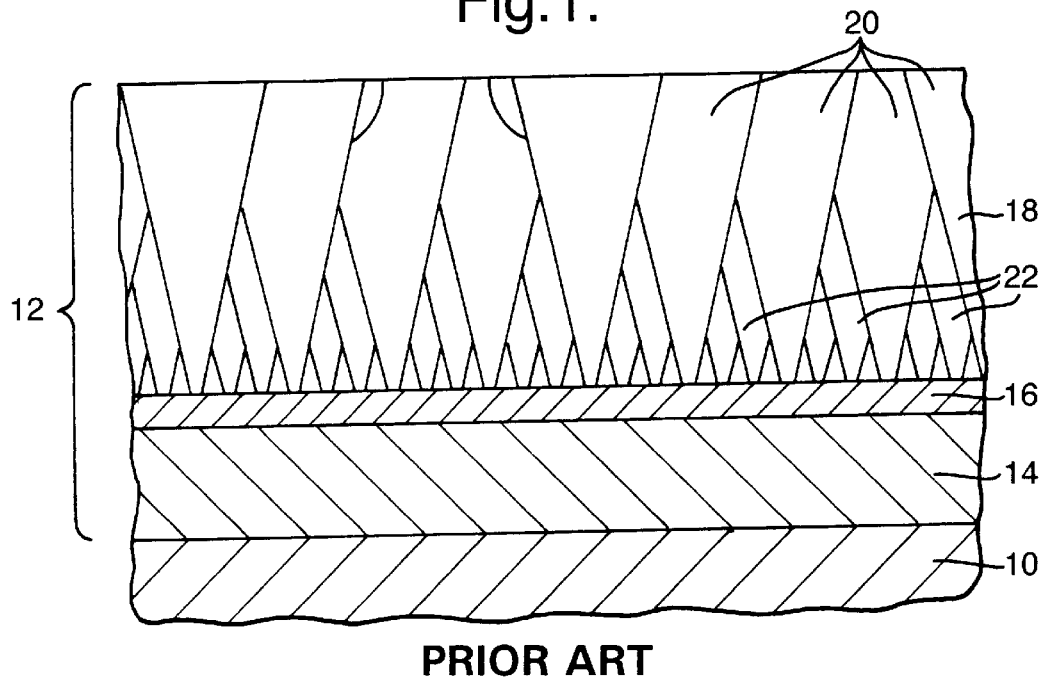
FIG. 1 is a cross-sectional diagrammatic view through a metallic article having a prior art thermal barrier coating.

Referring to FIG. 1, illustrating the prior art, there is shown part of a superalloy article 10 provided with a multi-layer thermal barrier coating indicated generally by numeral 12. It is shown in the as manufactured condition. The thermal barrier coating 12 comprises a bond coating 14 on the superalloy substrate 10, an oxide layer 16 on the bond coating 14 and a ceramic thermal barrier coating 18 on the oxide layer 16. The bond coating 14 is generally an aluminum containing alloy for example a MCrAlY alloy where M is at least one of nickel, cobalt or iron, a nickel aluminide, a cobalt aluminide or a platinum aluminide. The oxide layer generally comprises alumina together with other oxides.

The ceramic thermal barrier coating 18 comprises a plurality of columnar ceramic grains 20 and 22 which extend substantially perpindicular to the surface of the superalloy substrate 10. Furthermore it is seen that all of the columnar ceramic grains 20 and 22 nucleate on the oxide layer 16 and start to grow substantially perpendicular to the surface of the superalloy substrate 10. The columnar ceramic grains 20 and 22 grow competitively and the columnar ceramic grains 20 grow through the full thickness of the ceramic thermal barrier coating 18 whereas the columnar ceramic grains 22 are blocked out at various distances from the oxide layer 16 by the columnar ceramic grains 20. Thus it can be seen that the columnar ceramic grains 20 gradually increase in cross-sectional area with increasing distance from the oxide layer 16. Also the number of columnar ceramic grains 20 per unit area at the surface of the thermal barrier coating 18 is considerably less than the number of columnar ceramic grains 20, 22 per unit area at the surface of the alumina layer 16.

It is also seen that because the columnar ceramic grains 20 are increasing in area with increasing distance from the oxide layer 16 that the columnar ceramic grains 20 become interlocked so that there is very little, or no, clearance between the columnar ceramic grains 20. Also there are sub-grains in the columnar ceramic grains 20 and sub-grains projecting transversely from the columnar grains 20 and growing transversely and longitudinally from the columnar grains 20. The sub-grains in each columnar ceramic grain 20 do not all have the same crystal structure. The sub-grains projecting transversely from the columnar ceramic grains 20 become interlocked with the adjacent columnar ceramic grains 20 or the sub-grains projecting transversely from the adjacent columnar ceramic grains 20. The sub-grains projecting transversely from the columnar ceramic grains 20 interfere with the growth of adjacent columnar ceramic grains 20.

It has been found that the resistance to spallation of the prior art ceramic thermal barrier coating is not as good at the leading and trailing edge regions of turbine blades and turbine vanes and also at other regions where there is a rapid change in shape of the component e.g. small radii of curvature.

The multi-layer thermal barrier coating 12 is applied on the superalloy article 10 by firstly depositing a MCrAlY alloy bond coating 14 by plasma spraying or physical vapor deposition or forming a nickel aluminide bond coating 14 by diffusion aluminising or forming a platinum aluminide bond coating 14 by platinum modified diffusion aluminizing. The ceramic thermal barrier coating 18 is then applied onto the bond coating 14 by physical vapor deposition, usually electron beam physical vapor deposition. The oxide layer 16 forms on the bond coating 14 while the superalloy article 10 is heated up to the operating temperature in an electron beam physical vapor deposition chamber due to the presence of oxygen. The superalloy article 10 is rotated in the electron beam physical vapor deposition chamber in the ceramic vapors to produce the ceramic thermal barrier coating 18. The temperature of the superalloy article 10 is maintained at a temperature of 1000° C. to 1100° C. and the deposition rate of the ceramic on the superalloy article 10 is 3 to 5 micrometers per minute, and the rotation rate of the superalloy article 10 is 6 revolutions per minute.

Figure 2:
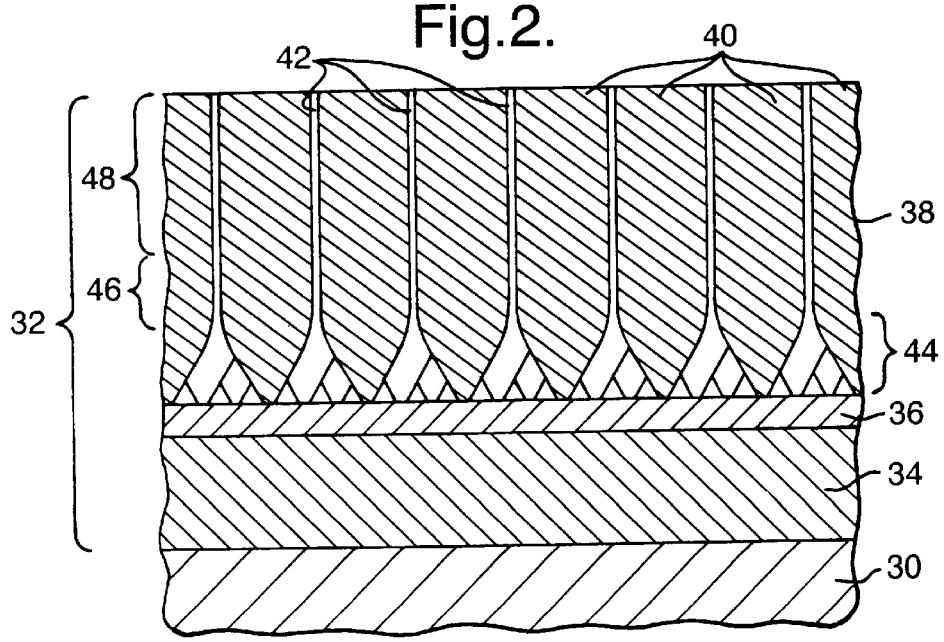
FIG. 2 is a cross-sectional diagrammatic view through a metallic article having a thermal barrier coating according to the present invention.

Referring to FIG. 2, illustrating the present invention, there is shown part of a superalloy article 30 provided with a multi-layer thermal barrier coating indicated generally by numeral 32. It is shown in the as manufactured condition. The thermal barrier coating 32 comprises a bond coating 34 on the superalloy substrate 30, an oxide layer 36 on the bond coating 34 and a ceramic thermal barrier coating 38 on the oxide layer 36. The bond coating 34 is generally an aluminum containing alloy for example a MCrAlY alloy where M is at least one of nickel, cobalt or iron, a nickel aluminide, a cobalt aluminide or a platinum aluminide. The oxide layer generally comprises alumina together with other oxides.

The ceramic thermal barrier coating 38 comprises a plurality of columnar ceramic grains 40 which extend substantially perpindicular to the surface of the superalloy substrate 30. Furthermore it is seen that all of the columnar ceramic grains 40 nucleate on the oxide layer 36 and start to grow substantially perpindicular to the surface of the superalloy substrate 30. The ceramic thermal barrier coating 38 comprises an inner portion 44 on the oxide layer 36, a transition portion 46 on the inner portion 44 and an outer portion 48 on the transition portion 46. The columnar ceramic grains 40 grow competitively in the inner portion 44, but in the transition portion 46 the columnar ceramic grains grow 40 progressively less competitively and in the outer portion 48 the columnar ceramic grains 40 grow in a steady state. Thus a greater number of the columnar ceramic grains 40 grow through the full thickness of the ceramic thermal barrier coating 38. Thus it can be seen that the columnar ceramic grains 40 remain substantially the same cross-sectional area with increasing distance from the oxide layer 36 in the outer portion 48 of the ceramic thermal barrier coating 38. Also the number of columnar ceramic grains 40 per unit area at the surface of the thermal barrier coating 38 is only slightly less than, preferably substantially the same as, the number of columnar ceramic grains 40 per unit area at the interface between the transition portion 46 and the outer portion 48.

Furthermore, it is seen that there is a distinct uniform clearance 42 between the columnar ceramic grains 40 in the outer portion 48 of the ceramic thermal barrier coating 38 which is maintained throughout the full thickness of outer portion 48 of the ceramic thermal barrier coating 38. The sub-grains in each columnar ceramic grain all have the same crystal structure and adjacent columnar ceramic grains fit together well and there are no sub-grains projecting transversely from, and growing from, the columnar ceramic grains 40. Thus the growth of the columnar ceramic grains 40 is not interfered with by any sub-grains projecting transversely from adjacent columnar ceramic grains 40. The columnar ceramic grains 40 in the outer portion 48 have smooth surfaces facing adjacent columnar ceramic grains 40.

It has been found that the resistance to spallation of the ceramic thermal barrier coating 38 according to the present invention is better than the prior art ceramic thermal barrier coating particularly at the leading and trailing edge regions of turbine blades and turbine vanes, but also at the pressure and suction surfaces of the turbine vanes and turbine blades.

It is believed that it is the columnar ceramic grains 40 with substantially uniform cross-sectional area with increasing distance from the oxide layer 36 in the outer portion 48 and the smooth confronting surfaces on the columnar ceramic grains 40 which reduces, preferably minimizes, the internal stress/strain within each of the columnar ceramic grains 40 and/or reduces, preferably minimizes, the stress/strain between adjacent columnar ceramic grains 40. Whereas it is believed that it is the columnar ceramic grains 20 with increasing cross-sectional area with increasing distance from the oxide layer 16 and the sub-grains projecting transversely from the columnar ceramic grains 20 which produces the greater internal stress/strain within each of the columnar ceramic grains 20 and/or has greater stress/strain between adjacent columnar ceramic grains 20.

It is believed that it is the reduced levels of stress/strain within each columnar ceramic grain 40 and between adjacent columnar ceramic grains 40 that provides the greater resistance to spallation of the ceramic thermal barrier coating 38. The stress/strain within the prior art ceramic thermal barrier coating is caused, we believe, because of the small, or no, clearance between adjacent columnar ceramic grains and the sub-grains projecting transversely from the columnar ceramic grains which causes interference and interlocking of the columnar ceramic grains. Whereas in the present invention the adjacent columnar ceramic grains in the outer portion have smooth confronting surfaces, are separated by distinct uniform clearances, and do not have sub-grains projecting transversely from the columnar ceramic grains.

The multi-layer thermal barrier coating 32 is applied on the superalloy article 30 by firstly depositing a MCrAlY alloy bond coating 34 by plasma spraying or physical vapor deposition or forming a nickel aluminide bond coating 34 by diffusion aluminizing or forming a platinum aluminide bond coating 34 by platinum modified diffusion aluminizing. The ceramic thermal barrier coating 38 is then applied onto the bond coating 34 by physical vapor deposition, usually electron beam physical vapor deposition. The oxide layer 36 forms on the bond coating 34 while the superalloy article 30 is heated up to the operating temperature in an electron beam physical vapor deposition chamber due to the presence of oxygen. The superalloy article 30 is rotated in the electron beam physical vapor deposition chamber in the ceramic vapors to produce the ceramic thermal barrier coating 38. The temperature of the superalloy article 30 is maintained at a temperature of 1000° C. to 1100° C. and the deposition rate of the ceramic on the superalloy article 30 is 3 to 5 micrometers per minute, and the rotation rate of the superalloy article 30 is 15 revolutions per minute. The ceramic deposits on the oxide layer 36 and initially the columnar ceramic grains 40 grow competitively in the inner portion 44. Thereafter the columnar ceramic grains 40 grow less competitively in the transition region 46 and finally in the outer portion 48 the columnar ceramic grains 40 grow with substantially uniform cross-sectional areas.

Figure 3:
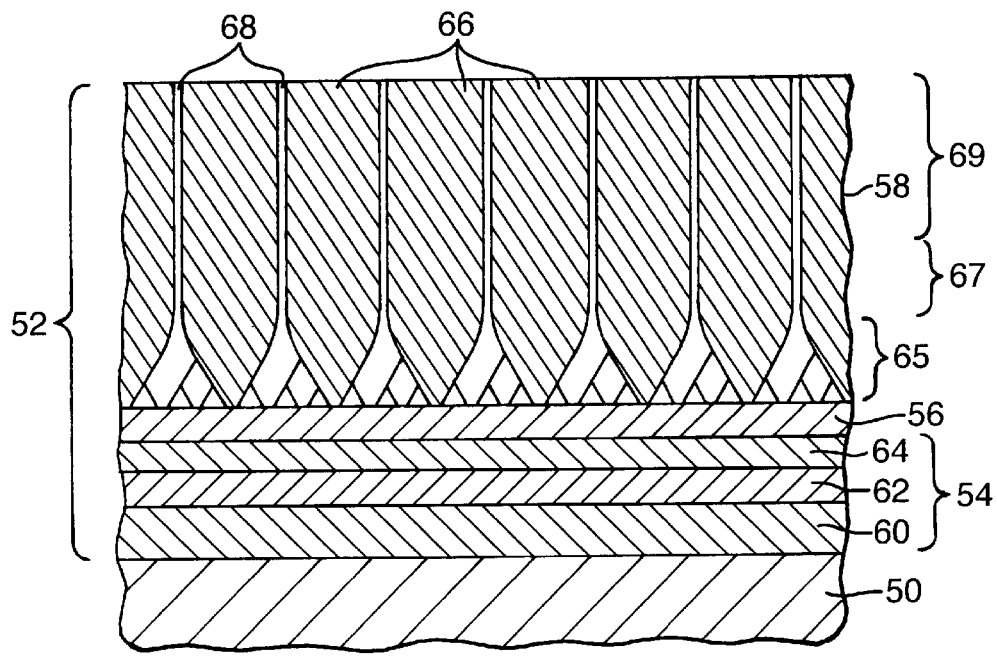
FIG. 3 is a cross-sectional diagrammatic view through a metallic article having another thermal barrier coating according to the present invention.

Referring to FIG. 3, illustrating a further embodiment of the present invention, there is shown part of a superalloy article 50 provided with a multi-layer thermal barrier coating indicated generally by numeral 52. It is shown in the as manufactured condition. The thermal barrier coating 52 comprises a bond coating 54 on the superalloy substrate 50, an oxide layer 56 on the bond coating 54 and a ceramic thermal barrier coating 58 on the oxide layer 56. The bond coating 54 is generally an aluminum containing alloy for example a MCrAlY alloy coating 60 where M is at least one of nickel, cobalt or iron, with a platinum enriched MCrAlY layer 62 and a platinum aluminide layer 64 as described more fully in European patent application EP0718419A. The oxide layer 56 generally comprises alumina.

The ceramic thermal barrier coating 58 is similar to that described with reference to FIG. 2 and again comprises columnar ceramic grains 66. The ceramic thermal barrier coating 58 comprises an inner portion 65, a transition portion 67 and an outer portion 69. The columnar ceramic grains 66 remain substantially the same cross-sectional area throughout the thickness of the outer portion 69. Also the number of columnar ceramic grains 66 per unit area at the surface of the thermal barrier coating 58 is only slightly less than, preferably substantially the same as, the number of columnar ceramic grains 66 per unit area at the interface between the transition portion 67 and the outer portion 69. Also the distinct uniform clearances 68 are formed between the columnar ceramic grains 66 and there are no sub-grains projecting transversely from the columnar ceramic grains 66.

The bond coating 54 is formed by depositing a MCrAlY alloy bond coating, then depositing platinum on the MCrAlY and then heat treating to diffuse the platinum into the MCrAlY.

Figure 4:
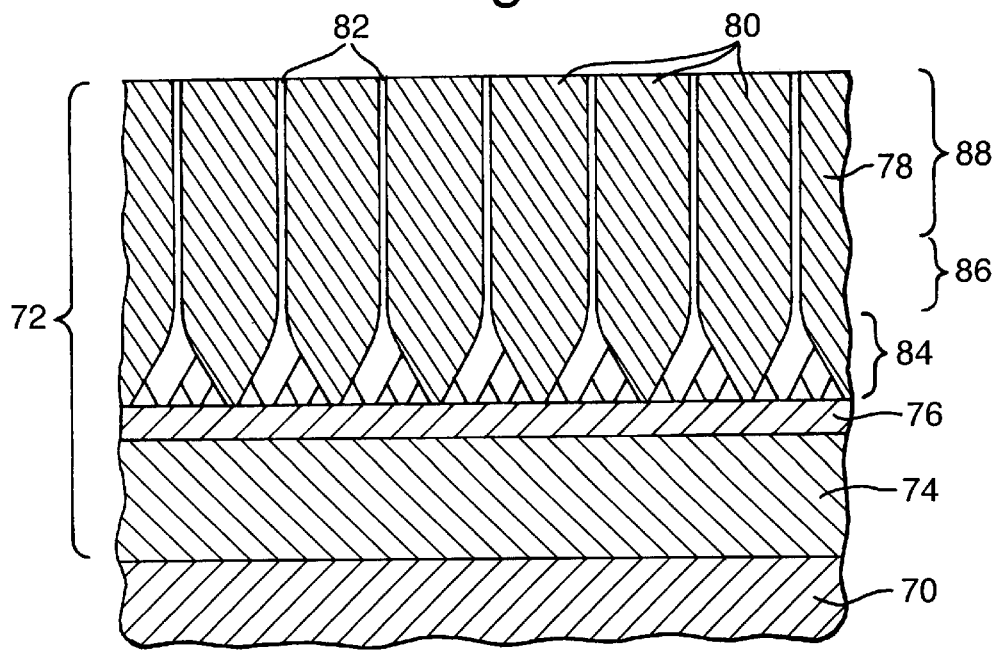
FIG. 4 is a cross-sectional diagrammatic view through a metallic article having a further thermal barrier coating according to the present invention.

Referring to FIG. 4, illustrating a further embodiment of the present invention, there is shown part of a superalloy article 70 provided with a multi-layer thermal barrier coating indicated generally by numeral 72. It is shown in the as manufactured condition. The thermal barrier coating 72 comprises a bond coating 74 on the superalloy substrate 70, an oxide layer 76 on the bond coating 74 and a ceramic thermal barrier coating 78 on the oxide layer 76. The bond coating 74 is generally a platinum enriched gamma and platinum enriched gamma prime layer on the superalloy as described more fully in European patent application EP0718420A. The oxide layer 76 generally comprises alumina.

The ceramic thermal barrier coating 78 is similar to that described with reference to FIG. 2 and again comprises columnar ceramic grains 80. The ceramic thermal barrier coating 78 comprises an inner portion 84, a transition portion 86 and an outer portion 88. The columnar ceramic grains 80 remain substantially the same cross-sectional area throughout the thickness of the outer portion 84. Also the number of columnar ceramic grains 80 per unit area at the surface of the thermal barrier coating 78 is only slightly less than, preferably substantially the same as, the number of columnar ceramic grains 80 per unit area at the interface between the transition portion 86 and the outer portion 88. Also the distinct uniform clearances 82 are formed between the columnar ceramic grains 80 and there are no sub-grains projecting transversely from the columnar ceramic grains 80.

The bond coating 74 is formed by depositing platinum on the superalloy and heat treating to diffuse the platinum into the superalloy.

Figure 5:
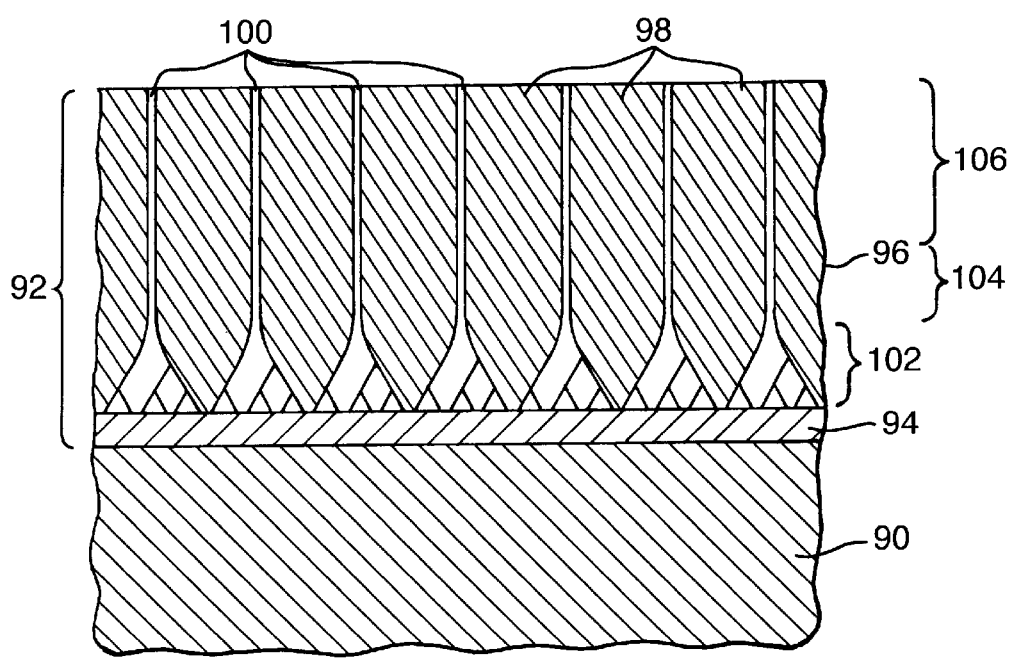
FIG. 5 is a cross-sectional diagrammatic view through a metallic article having a further thermal barrier coating according to the present invention.

Referring to FIG. 5, illustrating a further embodiment of the present invention, there is shown part of a superalloy article 90 provided with a multi-layer thermal barrier coating indicated generally by numeral 92. It is shown in the as manufactured condition. The thermal barrier coating 92 comprises a bond coating 94 on the superalloy substrate 90 and a ceramic thermal barrier coating 96 on the bond coating 94. The bond coating 94 comprises an oxide layer generally of alumina.

The ceramic thermal barrier coating 96 is similar to that described with reference to FIG. 2 and again comprises columnar ceramic grains 98. The ceramic thermal barrier coating 96 comprises an inner portion 102, a transition portion 104 and an outer portion 106. The columnar ceramic grains 98 remain substantially the same cross-sectional area throughout the thickness of the outer portion 106. Also the number of columnar ceramic grains 98 per unit area at the surface of the thermal barrier coating 96 is only slightly less than, preferably substantially the same as, the number of columnar ceramic grains 98 per unit area at the interface between the transition portion 104 and the outer portion 106. Also the distinct uniform clearances 100 are formed between the columnar ceramic grains 98 and there are no sub-grains projecting transversely from the columnar ceramic grains 98.

The bond coating 94 is formed by oxidizing the superalloy article 90.

Figure 6:
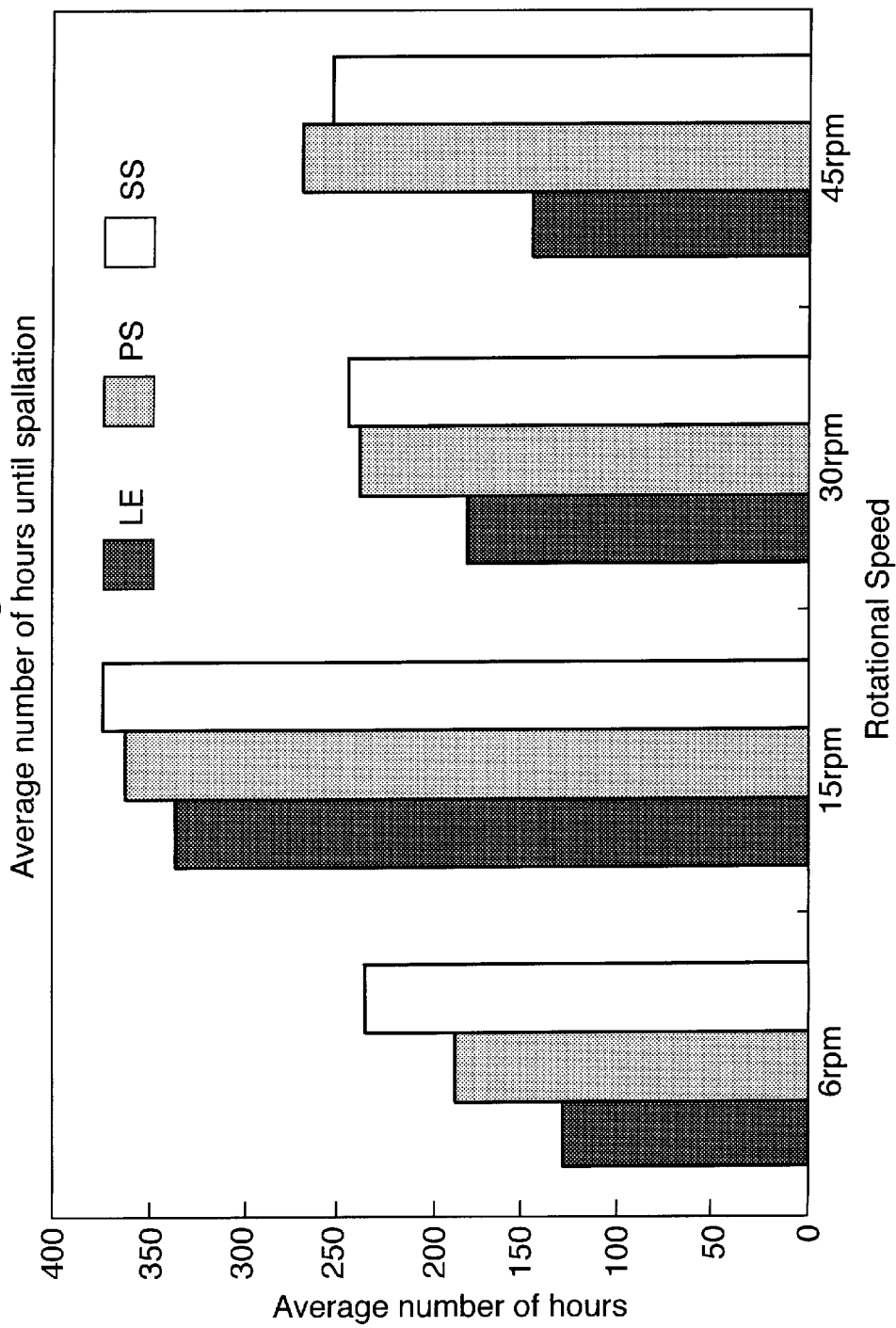
FIG. 6 is a graph showing average number of hours until spallation of the ceramic thermal barrier coating against speed of rotation of the metallic article at a constant temperature and at a constant evaporation rate.

Referring to FIG. 6 which shows the average number of hours to spallation of the ceramic thermal barrier coating against speed of rotation of the superalloy article at a constant temperature of 1000° C. to 1100° C. and at a constant deposition rate of ceramic onto the superalloy article of 3 to 5 micrometers per minute during deposition of the ceramic thermal barrier coating. In the test, samples of thermal barrier coatings deposited at constant temperature and constant deposition rate but at different rotational speeds were tested for spallation resistance. It is seen that at a rotational speed of 15 revolutions per minute the average number of hours until spallation of the ceramic thermal barrier coating occurs is greatest, for the leading edge, the suction surface and the pressure surface of a turbine blade or a turbine vane. Table 1 shows the average hours to spallation at 6 rpm, 15 rpm, 30 rpm and 45 rpm at the leading edge LE, pressure surface PS and suction surface SS of a turbine blade which are also indicated in FIG. 6.

TABLE 1

| | Average Hours to Spallation | | |
| --- | --- | --- | --- |
| Speed | Leading Edge (LE) | Suction Surface (SS) | Pressure Surface (PS) |
| 6 rpm | 127 | 185 | 235 |
| 15 rpm | 336 | 363 | 377 |
| 30 rpm | 183 | 241 | 248 |
| 45 rpm | 149 | 276 | 260 |

The ceramic thermal barrier coatings produced at 6 revolutions per minute and 15 revolutions per minute at a constant temperature of 1000° C. to 1100° C. and at a constant deposition rate of 3 to 5 micrometers per minute were examined using low voltage scanning electron microscopy to produce micrographs. Three lines were drawn across the micrographs at different levels in the ceramic thermal barrier coating and the average width of the columnar ceramic grains was measured on each line. A first line was drawn at 162 micrometers from the oxide surface, a second line was drawn at 100 micrometers from the oxide surface and a third line was drawn at 54 micrometers from the oxide surface.

The average width of the columnar ceramic grains for each of the three lines for the ceramic thermal barrier coating deposited at 6 rpm and 15 rpm are shown in Table 2.

TABLE 2

Average Width of the Columnar Ceramic Grains Micrometers

| | Distance from Substrate (micrometers) | | |
|---|---|---|---|
| Speed | 54 | 100 | 162 |
| 6 rpm | 4 | 6.1 | 7.6 |
| 15 rpm | 5.5 | 8.7 | 8.85 |

This demonstrates the fact that the average width of the columnar ceramic grains in the ceramic thermal barrier coating remains substantially uniform throughout the outer portion of the ceramic thermal barrier coating and the columnar ceramic grains are substantially uniform in cross-sectional area throughout the outer portion of the ceramic thermal barrier coating for distances greater than 100 micrometers from the surface of the bond coating according to the present invention. Thus the transition portion and inner portion are at distances less than 100 micrometers from the surface of the alumina. The interface between the transition portion and the outer portion is between 54 and 100 micrometers and thus is between 33% and 62% of the thickness of the ceramic thermal barrier coating. The outer portion is therefore between 38% and 67% of the thickness of the ceramic thermal barrier coating. Whereas the number of columnar ceramic grains in the ceramic thermal barrier coating decreases with increasing distance from the surface of the bond coating in the prior art and the columnar grains have increasing cross-sectional area with increasing distance from the surface of the bond coating.

The average widths of the columnar ceramic grains increases at the rate of 0.24 micrometers per 100 micrometer length of the columnar ceramic grain between 100 and 162 micrometers from the surface of the bond coating for the ceramic thermal barrier coating deposited at 15 rpm. The average width of the columnar ceramic grains increases at the rate of 2.5 micrometers per 100 micrometer length of the columnar ceramic grain between 100 and 162 micrometers from the surface of the bond coating for the ceramic thermal barrier coating deposited at 6 rpm.

Thus it can be seen from Table 2 that the rate of increase of the widths of the columnar ceramic grains is between nine and ten times more for the ceramic thermal barrier coating deposited at 6 rpm than those deposited at 15 rpm between 100 and 160 micrometers from the surface of the substrate.

The pressure and suction surfaces of turbine blades coated with ceramic thermal barrier coatings deposited at 6 rpm and 15 rpm were examined by X-ray diffraction to determine the width of the X-ray diffraction peaks. The width of the X-ray diffraction peaks is an indication of the strain within the structure of the ceramic thermal barrier coatings. The greater the width of the X-ray diffraction peak the greater the strain.

The width of the 511 and 620 X-ray diffraction peaks on the pressure surface of the ceramic thermal barrier coating deposited at 6 rpm and 15 rpm are shown in Table 3.

| | Speed of Rotation | | | |
|---|---|---|---|---|
| | 6 rpm | | 15 rpm | |
| | Peak | | Peak | |
| Position | 511 | 620 | 511 | 620 |
| Pressure Surface (PS) | 0.359 | 0.984 | 0.298 | 0.822 |
| Suction Surface (SS) | — | 0.990 | — | 0.853 |

It can be seen from the X-ray diffraction peaks that the strain in the ceramic thermal barrier coating deposited at 6 rpm is greater than the strain in the ceramic thermal barrier coating deposited at 15 rpm.

Figure 7:
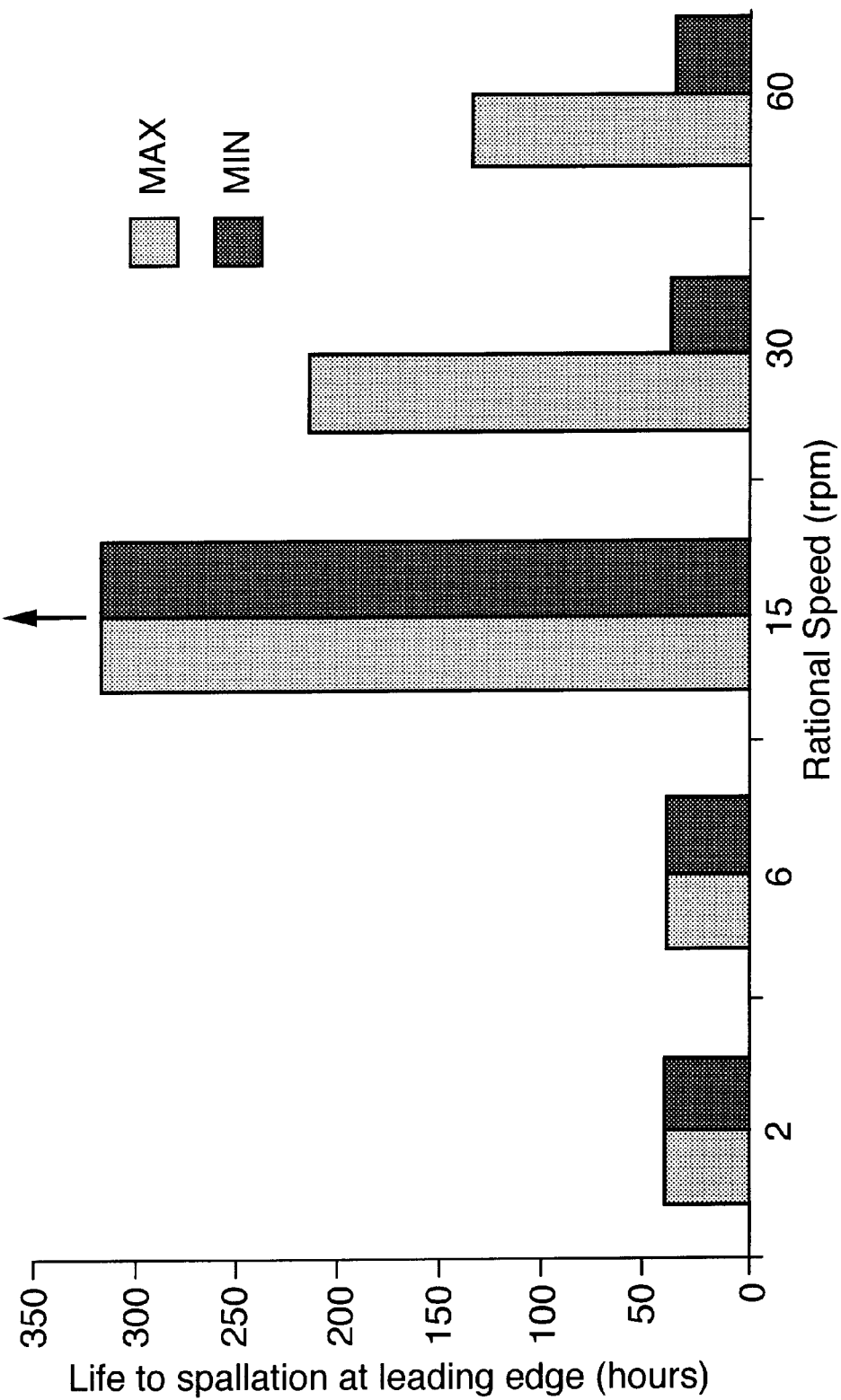
FIG. 7 is another graph showing numbers of hours until spallation of the ceramic thermal barrier coating against speed of rotation of the metallic article at a constant temperature and at a constant evaporation rate.

Referring to FIG. 7 which shows the minimum and maximum number of hours to spallation of the ceramic thermal barrier coating against speed of rotation of the superalloy article at a constant temperature of 1000° C. to 1100° C. and at a constant deposition rate of ceramic onto the superalloy article of 3 to 5 micrometers per minute during deposition of the ceramic thermal barrier coating. In the test MAR-M002 superalloy turbine blades were provided with a platinum aluminide bond coating by platinum aluminizing and an oxide was formed on the platinum aluminide. Samples of thermal barrier coatings were deposited at constant temperature and constant deposition rate but at different rotational speeds. These were tested for spallation resistance at the leading edges. It is clearly seen that for the leading edge of a turbine blade, or turbine vane, the minimum and maximum number of hours until spallation of the ceramic thermal barrier coating is greatest when the ceramic thermal barrier coating is deposited at 15 revolutions per minute. Table 4 shows the minimum and maximum hours to spallation at 2 rpm, 6 rpm, 15 rpm, 30 rpm and 60 rpm at the leading edge of a turbine blade, these are also indicated in FIG. 7.

TABLE 4

Hours to Spallation at Leading Edge (LE)

| Speed | minimum | maximum |
|---|---|---|
| 2 rpm | 50 | 50 |
| 6 rpm | 50 | 50 |
| 15 rpm | 320* | 320* |
| 30 rpm | 50 | 220 |
| 60 rpm | 50 | 150 |

*The ceramic thermal barrier coating deposited at 15 rpm had not spalled after 320 hours of tests.

The average width of the columnar ceramic grains on the suction surface (SS) of the ceramic thermal barrier coating at 50, 100, 150 and 200 micrometers from the surface of the substrate were measured for ceramic thermal barrier coatings deposited at 6 rpm and 15 rpm and these are shown in Table 5.

TABLE 5

Average Width of the Columnar Ceramic Grains Micrometers

| | Distance from Substrate (micrometers) | | | | |
|---|---|---|---|---|---|
| Speed | 50 | 100 | 150 | 200 | 250 |
| 6 rpm | 4.0 | 6.35 | 10.35 | 13.55 | — |
| 15 rpm | 4.25 | 6.20 | 8.8 | 10.85 | 10.5 |

This also demonstrates the fact that the average width of the columnar ceramic grains in the ceramic thermal barrier coating remains substantially uniform throughout the outer portion of the ceramic thermal barrier coating and the columnar ceramic grains are substantially uniform in cross-sectional area throughout the outer portion of the ceramic thermal barrier coating for distances greater than 150 micrometers from the surface of the bond coating according to the present invention. Thus the transition portion and inner portion are at distances less than 150 micrometers from the surface of the alumina. The interface between the transition portion and the outer portion is between 100 and 150 micrometers and thus is between 40% and 60% of the thickness of the ceramic thermal barrier coating. The outer portion is therefore between 40% and 60% of the thickness of the ceramic thermal barrier coating. Whereas the number of columnar ceramic grains in the ceramic thermal barrier coating decreases with increasing distance from the surface of the bond coating in the prior art and the columnar grains have increasing cross-sectional area with increasing distance from the surface of the bond coating.

The average width of the columnar ceramic grains increases at the rate of 1.7 micrometers per 100 micrometer length of the columnar ceramic grain between 150 and 250 micrometers from the surface of the substrate for the ceramic thermal barrier coating deposited at 15 rpm. The average width of the columnar ceramic grains increases at the rate of 6.44 micrometers per 100 micrometer length of the columnar ceramic grain between 150 and 200 micrometers from the surface of the substrate for the ceramic thermal barrier coating deposited at 6 rpm.

Thus it can be seen from Table 5 that the rate of increase of the widths of the columnar ceramic grains is between three and four times more for the ceramic thermal barrier coating deposited at 6 rpm than those deposited at 15 rpm between 150 and 200 micrometers from the surface of the substrate.

Figure 8:
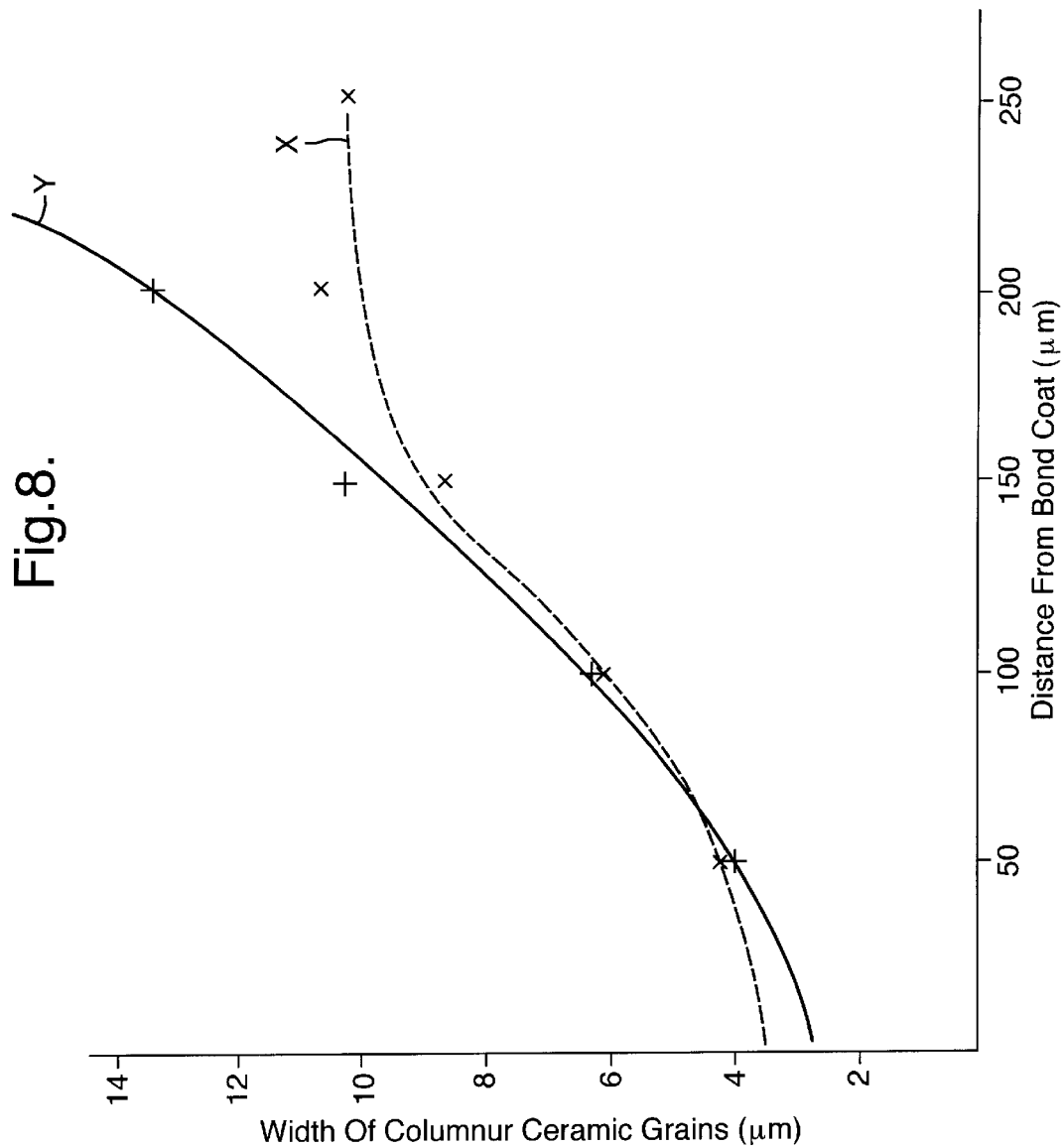
FIG. 8 is a schematic graph showing width of columnar ceramic grains against distance from the substrate.

FIG. 8 is a graph showing the widths of the columnar ceramic grains with increasing distances from the surface of the alumina. Line X indicates the columnar ceramic grains according to the present invention and line Y indicates the columnar ceramic grains according to the prior art.

Thus it is necessary to produce columnar ceramic grains which have substantially uniform cross-sectional area throughout their lengths in the outer portion of the ceramic thermal barrier coating, which have smooth surfaces and which have uniform clearances with adjacent columnar ceramic grains to minimize stress/strain to increase spallation resistance of the ceramic thermal barrier coating. This may be achieved by controlling the temperature of the article, the evaporation rate of the ceramic and the speed of rotation of the article. The above example has shown that by maintaining evaporation rate and temperature constant the speed of rotation should be adjusted until the required columnar ceramic grain structure is achieved. It may be equally possible to obtain the same columnar ceramic grain structure by maintaining the evaporation rate and speed of rotation constant and adjusting the temperature or by maintaining the temperature and speed of rotation constant and adjusting the evaporation rate.

It is important that the temperature of the article or component, the rate of arrival of ceramic onto the article or component and the rate of rotation of the article or component are balanced such that the columnar ceramic grains grow with a uniform cross-sectional area throughout their lengths, with smooth surfaces and with distinct uniform clearances between adjacent columnar ceramic grains. The rate of arrival of ceramic is called the deposition rate. The rate of arrival is determined by the evaporation rate of the ceramic. Thus the temperature of the article, the deposition rate and the rate of rotation of the article are controlled such that the columnar ceramic grains grow with a uniform cross-sectional area throughout their lengths, with smooth surface and with a distinct uniform clearances between adjacent columnar ceramic grains.

It has also been found that once the columnar ceramic grains have been nucleated and have started to grow with substantially uniform cross-sectional areas, it is possible to reduce the speed of rotation of the article and still obtain the required columnar ceramic grain structure. It is believed that it is the conditions at the initial stages of deposition of the ceramic that is important in determining the final columnar ceramic grain structure.

The average width of the columnar ceramic grains may vary depending on the position on the surface of the metallic article. In the case of a metallic turbine blade, or metallic turbine vane, the columnar ceramic grains have the greatest width at the leading edge, the smallest width on the pressure surface and an intermediate width on the suction surface.

Although the invention has been described with reference to physical vapor deposition, it is also possible to apply the same technique to chemical vapor deposition and combustion chemical vapor deposition as is described in International patent application WO9721848A published Jun. 19 1997.

I claim:

1. A metallic article comprising a bond coating on the metallic article and a ceramic thermal barrier coating on the bond coating, the ceramic thermal barrier coating comprising a plurality of columnar grains extending substantially perpendicular to the surface of the metallic article, the ceramic thermal barrier coating comprising an inner portion adjacent the bond coating, a transition portion on the inner portion and an outer portion on the transition portion, the inner portion having columnar grains grown in a competitive manner, the outer portion having columnar grains grown in a steady state manner, the transition portion having columnar grains grown in transition from competitive manner to steady state manner, in the outer portion each columnar grain having substantially constant cross-sectional area throughout its length, each columnar grain having smooth sides without the presence of sub-grains projecting therefrom and each columnar grain being separated from adjacent columnar grains by uniform clearances to minimize the stress and strain in the columnar grains and/or to minimize the stress and strain between adjacent columnar grains and thereby increase the resistance to spallation of the ceramic thermal barrier coating.

2. A metallic article as claimed in claim 1 wherein the bond coating comprises an aluminum containing bond coating on the metallic article, the aluminum containing bond coating having an alumina surface layer, the ceramic thermal barrier coating being arranged on the alumina layer.

3. A metallic article as claimed in claim 2 wherein the aluminum containing bond coating comprises a MCrAlY bond coating, where M is at least one of cobalt, iron and nickel, an aluminide coating or a platinum aluminide coating.

4. A metallic article as claimed in claim 1 wherein the bond coating comprises a MCrAlY bond coating on the metallic article, where M is at least one of cobalt, iron and nickel, a platinum enriched MCrAlY layer on the MCrAlY bond coating, a platinum aluminide layer on the platinum enriched MCrAlY layer, the platinum aluminide layer having an alumina surface layer, the ceramic thermal barrier coating being arranged on the alumina layer.

5. A metallic article as claimed in claim 1 wherein the metallic article has an alumina surface layer, the ceramic thermal barrier coating being arranged on the alumina layer.

6. A metallic article as claimed in claim 1 wherein the metallic article comprises a nickel superalloy article or a cobalt superalloy article.

7. A metallic article as claimed in claim 1 wherein the metallic article comprises a turbine blade or a turbine vane.

8. A metallic article as claimed in claim 1 wherein the ceramic thermal barrier coating comprises zirconia.

9. A metallic article as claimed in claim 8 wherein the zirconia is stabilized with yttria.

10. A metallic article as claimed in claim 1 wherein the outer portion is between 38% and 67% of the thickness of the ceramic thermal barrier coating.

11. A metallic article as claimed in claim 10 wherein the outer portion is between 40% and 60% of the thickness of the ceramic thermal barrier coating.

12. A metallic article as claimed in claim 1 wherein the width of the columnar grains in the outer portion increases at a rate equal to or less than 2.0 micrometers per 100 micrometer length of the columnar grain in the outer portion.

13. A metallic article as claimed in claim 12 wherein the width of the columnar grains in the outer portion increases at a rate equal to or less than 1.7 micrometers per 100 micrometer length of the columnar grain in the outer portion.

14. A metallic article as claimed in claim 13 wherein the width of the columnar grains in the outer portion increases at a rate equal to or less than 0.24 micrometers per 100 micrometer length of the columnar grain in the outer portion.

15. A method of applying a ceramic thermal barrier coating to a metallic article, comprising the steps of: forming a bond coating on the metallic article, applying a ceramic thermal barrier coating to the bond coating by vapor deposition to form a plurality of columnar grains extending substantially perpendicular to the surface of the metallic article, the vapor deposition of the ceramic thermal barrier coating comprising depositing an inner portion adjacent the bond coating, depositing a transition portion on the inner portion and depositing an outer portion on the transition portion, the inner portion having columnar grains grown in a competitive manner, the outer portion having columnar grains grown in a steady state manner, the transition portion having columnar grains grown in transition from competitive manner to steady state manner, and in the outer portion each columnar grain having a substantially constant cross-sectional area throughout its length, each columnar grain having smooth sides without the presence of sub-grains projecting therefrom and each columnar grain being separated from adjacent columnar grains by uniform clearances to minimize the stress and strain in the columnar grain and/or to minimize the stress and strain between adjacent columnar grains and thereby increase the resistance to spallation of the ceramic thermal barrier coating.

16. A method as claimed in claim 15 comprising controlling the rate of evaporation of the ceramic, the temperature of the metallic article and the rate of rotation of the metallic article during the vapor deposition of the ceramic thermal barrier coating.

17. A method as claimed in claim 16 wherein the evaporation rate of ceramic is 3 to 5 micrometers per minute, the temperature of the metallic article is 1000° C. to 1100° C. and the rate of rotation of the metallic article is 15 revolutions per minute.

18. A method as claimed in claim 15 comprising applying an aluminum containing bond coating on the metallic article and forming an alumina layer on the aluminum containing bond coating.

19. A method as claimed in claim 18 wherein the aluminum containing bond coating comprises a MCrAlY alloy, where M is at least one of cobalt, iron and nickel, an aluminide or a platinum aluminide.

20. A method as claimed in claim 15 comprising applying a MCrAlY bond coating on the metallic article, where M is at least one of cobalt, iron and nickel, forming a platinum enriched MCrAlY layer on the MCrAlY bond coating, forming a platinum aluminide layer on the platinum enriched MCrAlY layer, forming an alumina surface layer on the platinum aluminide layer.

21. A method as claimed in claim 15 comprising forming an alumina surface layer on the metallic article.

22. A method as claimed in claim 15 wherein the metallic article comprises a nickel superalloy article or a cobalt superalloy article.

23. A method as claimed in claim 15 wherein the metallic article comprises a turbine blade or a turbine vane.

24. A method as claimed in claim 15 wherein the ceramic thermal barrier coating comprises zirconia.

25. A method as claimed in claim 24 wherein the zirconia is stabilized with yttria.

26. A method as claimed in claim 15 wherein the ceramic thermal barrier coating is applied by physical vapor deposition.

27. A method as claimed in claim 26 wherein the ceramic thermal barrier coating is applied by electron beam physical vapor deposition.

* * * * *